(12) United States Patent
Tsukada et al.

(10) Patent No.: US 6,228,466 B1
(45) Date of Patent: May 8, 2001

(54) PRINTED WIRING BOARD AND METHOD FOR MANUFACTURING THE SAME

(75) Inventors: Kiyotaka Tsukada; Masaru Takada; Mitsuhiro Kondo; Hiroyuki Kobayashi, all of Ogaki (JP)

(73) Assignee: Ibiden Co. Ltd., Gifu-ken (JP)

( * ) Notice: Subject to any disclaimer, the term of this patent is extended or adjusted under 35 U.S.C. 154(b) by 0 days.

(21) Appl. No.: 09/319,506

(22) PCT Filed: Mar. 9, 1998

(86) PCT No.: PCT/JP98/00956

§ 371 Date: Jun. 7, 1999

§ 102(e) Date: Jun. 7, 1999

(87) PCT Pub. No.: WO98/47179

PCT Pub. Date: Oct. 22, 1998

(30) Foreign Application Priority Data

| Apr. 11, 1997 | (JP) | 9-110409 |
| May 12, 1997 | (JP) | 9-137682 |
| Jun. 3, 1997 | (JP) | 9-161872 |
| Feb. 6, 1998 | (JP) | 10-041241 |

(51) Int. Cl.[7] ............... B32B 3/00; H05K 1/00
(52) U.S. Cl. ............ 428/209; 174/255; 174/258; 174/261
(58) Field of Search ............... 428/209; 174/255, 174/258, 261

(56) References Cited

U.S. PATENT DOCUMENTS 6,010,769   1/2000   Sasaoka et al. ............... 428/209

FOREIGN PATENT DOCUMENTS

| 1-145891 | 6/1989 | (JP) . |
| 4-38452 | 2/1992 | (JP) . |
| 8-83865 | 3/1996 | (JP) . |

*Primary Examiner*—Cathy F. Lam
(74) *Attorney, Agent, or Firm*—Pillsbury Winthrop LLP

(57) ABSTRACT

A printed wiring board which has a conductor circuit (12) on an insulating substrate (10) and a surface insulating layer (14) formed on the surface of the substrate (10) including the surface of the conductor circuit (12). Part of the conductor circuit (12) has an exposed conductor section (120) having an exposed surface, and a surface insulating layer (140) around the conductor section (120) forms a recessed section at the same level of the surface of the conductor section (120) or lower than the surface. It is preferable to form a black or white solder resist layer on the surface insulating layer.

20 Claims, 9 Drawing Sheets

PRINTED WIRING BOARD AND METHOD FOR MANUFACTURING THE SAME

This application is the national phase of international application PCT/JP98/00956 filed Mar. 9, 1998 which designated the U.S.

BACKGROUND OF THE INVENTION

The present invention relates to a printed wiring board having bumps, ball pads or the like to which solder balls are applied, and a method of manufacturing the same.

There is a conventional printed wiring board which has a conductor circuit on an insulating substrate and a surface insulating layer provided on the surfaces of the insulating substrate and the conductor circuit and formed of a solder resist layer or a glass cloth resin layer.

In general, bumps or ball pads are provided on the surface of the printed wiring board which is connected to an electronic part, another printed wiring board or the like via solder balls applied on those bumps or ball pads.

The bumps or ball pads are formed by exposing the conductor circuit underlying the surface insulating layer by local removal of the surface insulating layer.

This conventional printed wiring board has the following drawbacks.

At the time of forming bumps or ball pads on the printed wiring board, the surface insulating layer is locally removed, thereby exposing the sides of the conductor circuit. This may reduce the strength of adhesion between the conductor circuit and the insulating substrate.

In providing solder balls on the bumps or ball pads with the above structure, the solder balls on the bumps or ball pads may be flattened due to the exposed sides of the conductor circuit and high adhesion strength of the solder balls to those sides.

When the solder balls are flattened, it is not possible to maintain the proper distance between the insulating substrate and an electronic part, another printed wiring board or the like which is connected to this printed wiring board via the solder balls. This may result in a reduced reliability of connection between them.

As the amount of heat generated by electronic parts tends to increase, printed wiring boards are provided with heat discharging means such as connection of solder balls or formation of thermal via holes for discharging heat. The heat discharging performance of the conventional printed wiring boards, however, has not yet been improved to a satisfactory level.

Accordingly, it is an object of the present invention to provide a printed wiring board with excellent heat discharging performance, which has an enhanced adhesion strength between a conductor circuit and an insulating substrate and ensures a high reliability of connection between this printed wiring board and a mounted part, such as another electronic part or another printed wiring board at the time of connecting such a part to this printed wiring board via solder balls applied to bumps, ball pads or the like provided on the conductor circuit and the insulating substrate, and a method of manufacturing the same.

SUMMARY OF THE INVENTION

According to a first aspect of this invention, a printed wiring board comprises an insulating substrate having a conductor circuit thereon; and a surface insulating layer provided on surfaces of the insulating substrate and the conductor circuit and formed of a solder resist layer or a glass cloth resin layer, part of the conductor circuit having an exposed conductor section with an exposed surface, the surface insulating layer around the exposed conductor section forming a recessed section level the same height as or lower than the surface of that exposed conductor section and higher than the surface of the insulating substrate, the surface insulating layer of the recessed section being in contact with sides of the exposed conductor section.

The recessed section and the exposed conductor section can be used as a so-called bump or a ball pad. Specifically, a solder ball or the like is put on the exposed conductor section, and a to-be-mounted part such as another electronic part or another printed wiring board can be connected to this printed wiring board via such solder balls while securing electric connection to the conductor circuit.

The to-be-mounted part may be a pad of an electronic part such as a flip chip, BGA (Ball Grid Array), chip scale package, chip size package, TCP (Tape Carrier Package) or lead-less chip carrier, or a printed wiring board on which such an electronic part is to be mounted.

The advantages of the first aspect of this invention will be described below.

In a printed wiring board according to the first aspect of this invention, part of the conductor circuit has an exposed conductor section with an exposed surface.

The surface insulating layer around the exposed conductor section forms a recessed section level the same height as or lower than the surface of that exposed conductor section and higher than the surface of the insulating substrate, and the surface insulating layer of the recessed section is in contact with sides of the exposed conductor section.

This structure allows the surface insulating layer to cover the sides of the conductor circuit, thereby reducing the amount of exposure of the sides. This enhances the adhesion strength between the conductor circuit and the insulating substrate. The increased adhesion strength can prevent the conductor circuit from being separated from the insulating substrate.

When a solder ball is put on the exposed conductor section, it is repelled by the surface insulating layer and is less likely become flattened.

That is, a solder ball adheres well to the sides of the conductor circuit. Therefore, solder forming the solder ball easily moves to cover the sides of the conductor circuit so that the amount of solder remaining on the surface of the exposed conductor section is reduced by the amount of the movement.

As the amount of exposure of the sides of the conductor circuit of the printed wiring board according to the first aspect of the invention is small, a large amount of solder can remain on the exposed conductor section.

This permits the proper distance to be maintained between the exposed conductor section and a to-be-mounted part, such as another electronic part or another printed wiring board, at the time of connecting the to-be-mounted part to this printed wiring board using solder balls. It is thus possible to increase the reliability of connection between the to-be-mounted part and the exposed conductor section (conductor circuit).

As apparent from the above, the first aspect of this invention can provide a printed wiring board, which has an enhanced adhesion strength between a conductor circuit and an insulating substrate and can ensure a high reliability of connection between this printed wiring board and a to-bemounted part such as another electronic part or another printed wiring board at the time of connecting such a part to this printed wiring board via solder balls applied to bumps, ball pads or the like provided on the conductor circuit and the insulating substrate.

The printed wiring board acquired by the first aspect of this invention can be used for a memory module, multi-chip module, mother board, daughter board, plastic package or the like which demands a high connection reliability.

It is preferable that the surface insulating layer is formed of a glass cloth resin layer. This provides a structure which can endure stress caused by a thermal expansion difference between a chip or package and the substrate. Further, this structure reduces the thermal expansion difference, resulting in a better performance.

It is preferable that the surface insulating layer should have a double-layer structure comprising a solder resist layer and a glass cloth resin layer formed on the surface thereof.

As the solder resist effectively repels solder, it suppresses sideward spreading of solder and has an effect of setting a chip or package apart from the printed wiring board so that thermal stress can be avoided more.

It is preferable that the surface insulating layer of the recessed section is positioned lower than the surface of the exposed conductor section by 0 to 15 $\mu$m. This ensures high strength of solder balls and high positioning precision. Further, it is less likely to cause a short-circuiting defect in connecting a to-be-mounted part using solder balls at narrow pitches.

When the surface of the surface insulating layer is set higher than the exposed conductor section, the positioning precision of a solder ball is high but stress is applied to the solder ball due to the thermal expansion difference caused by a change in temperature by resin located at the neck portion of the solder ball. The solder ball is likely to fatigue due to a long period of usage, thus reducing the adhesion strength.

When the positional value of the surface insulating layer exceeds 15 $\mu$m, a solder ball moves so as to wet the sides of the bump or ball pad so that the solder ball may be spread sideways. At the time of arranging the solder balls at narrow pitches, therefore, one solder ball may be in contact with (short-circuited with) an adjoining one. As the distance between a to-be-mounted part and the substrate tends to decrease, stress concentrates on the junction when parts of different coefficients of thermal expansion are connected so that one solder ball may be in contact with (short-circuited with) an adjoining one.

It is preferable that the exposed conductor section is covered with a metal plated film in such a way as to surround upper end portions of the sides of the exposed conductor section from the surface thereof, and a solder ball should be connected to the exposed conductor section and should be partly located in a cavity formed between a peripheral edge of the metal plated film and the sides of the exposed conductor section. This allows a solder ball to come into the cavity, and demonstrates an excellent junction effect due to its anchoring effect.

According to the first aspect of the invention, there is also provided a method of manufacturing a printed wiring board comprising an insulating substrate having a conductor circuit thereon, and a surface insulating layer provided on surfaces of the insulating substrate and the conductor circuit and formed of a solder resist layer or a glass cloth resin layer, part of the conductor circuit having an exposed conductor section with an exposed surface, the surface insulating layer around the exposed conductor section forming a recessed section level the same height as or lower than the surface of that exposed conductor section and higher than the surface of the insulating substrate, the surface insulating layer of the recessed section being in contact with sides of the exposed conductor section, which method comprises the steps of:

forming a conductor circuit on the insulating substrate;

forming the surface insulating layer on the insulating substrate and the surface of the conductor circuit; and irradiating a laser beam on the surface insulating layer to expose part of the conductor circuit, thereby forming an exposed conductor section, and setting the surface insulating layer around the conductor circuit lower than a surface of the exposed conductor section, thereby forming a recessed section.

The formation of an exposed conductor section using a laser beam is accomplished by irradiating the laser beam on the surface insulating layer where the conductor circuit is to be exposed. It is preferable to use a carbon dioxide laser with large energy or an excimer laser which is free of a thermal influence to generate the laser beam.

The formation of an exposed conductor section by irradiation of a laser beam is implemented by vapor removal of the surface insulating layer by the high energy of the laser beam. At this time, the portion where the laser beam is irradiated consists of a portion where the conductor circuit and the surface insulating layer are stacked on the insulating substrate, and a portion where the surface insulating layer directly lies on the insulating substrate.

The laser beam which hits on the portion where the conductor circuit is present exposes the conductor circuit, thus forming an exposed conductor section. The laser beam which hits on the portion where the conductor circuit is not present can vaporize the surface insulating layer which is located lower than the surface of the exposed conductor section. Since the laser beam is reflected at a metal portion like a conductor circuit, it is difficult to remove the metal portion (and an underlying material).

By setting the intensity of the laser beam to or slightly higher than the intensity that can remove the surface insulating layer provided on the conductor circuit, therefore, it is possible to form an exposed conductor section at the portion where the conductor circuit is present and to form a recessed section at the surface of the surface insulating layer around the exposed conductor section where no conductor circuit is present. The recessed section has the same level or lower than the surface of the exposed conductor section. It is to be noted that the surface insulating layer remains on any portion where the laser beam is not irradiated.

Through the above processing, a recessed section having an exposed conductor section in the center as shown in FIGS. 1 to 4 can be formed.

As apparent from the above, this manufacturing method can easily produce an exposed conductor section and a recessed section on the printed wiring board of the first aspect of the invention. This printed wiring board has the above-described excellent properties.

As apparent from the above, the first aspect of this invention can provide a method of manufacturing a printed wiring board, which has an enhanced adhesion strength between a conductor circuit and an insulating substrate and can ensure a highly reliable connection between this printed wiring board and another electronic part or another printed wiring board at the time of connecting such a part to this printed wiring board via solder balls applied to bumps, ball pads or the like provided on the conductor circuit and the insulating substrate.

It is preferable that the surface insulating layer is formed of a glass cloth resin layer. As mentioned earlier, this provides a structure which can endure stress caused by a thermal expansion difference between a chip or package and the substrate. Further, this structure reduces the thermal expansion difference, resulting in better performance.

It is preferable that the surface insulating layer has a double-layer structure comprising a solder resist layer and a glass cloth resin layer formed on the surface thereof.

As mentioned earlier, because the solder resist effectively repels solder, it suppresses sideward spreading of solder and has an effect of setting a chip or package apart from the printed wiring board so that thermal stress can be avoided.

The solder resist may be formed using a thermosetting solder resist, photo-curing solder resist or the like.

The color of the solder resist may be any of black, white and green.

According to a second aspect of this invention, there is provided a printed wiring board having an insulating substrate provided on a surface thereof with pads for connection of connection terminals, the surface of the insulating substrate being covered with a black solder resist layer, including peripheral edges of the pads.

The advantages of the second aspect of this invention will be discussed below. According to the second aspect of this invention, the solder resist layer is black so that it easily absorbs heat. The solder resist layer discharges heat in the air from the surface after actively absorbing the heat generated by an electronic part. The speed of movement of heat from the solder resist layer to the air is therefore accelerated. The black solder resist layer can thus quickly discharge the heat generated by an electronic part into the air.

Further, the solder resist layer covers the peripheral edge of a pad to connect to a connection terminal, through which electricity is exchanged between the printed wiring board and another member. The heat absorbed by the solder resist layer is thus transmitted to the connection terminal efficiently, and can efficiently be discharged via the member that is connected to the connection terminal.

The peripheral edge of the pad is covered with the solder resist layer, but the center portion is not.

The peripheral edge of the pad is a portion which has a certain width from the contour of the pad toward the center. It is preferable that the width of the peripheral edge of the pad should be 0.02 mm to 0.2 mm. When this width is less than 0.02 mm, the heat absorbed by the solder resist layer may not be transmitted to the connection terminal efficiently. When the width is larger than 0.2 mm, the solder resist layer may interfere with connection of the connection terminal to the pad.

The solder resist layer has a hole in, for example, a portion corresponding to the center portion of the pad. This hole may be formed by forming a solder resist layer on the entire surface of the insulating substrate and then irradiating a beam from a carbon dioxide laser, a YAG laser, an excimer laser or the like on a hole-to-be-formed portion of the solder resist layer, thereby burning out that portion.

A connection terminal through which electricity is exchanged with another member is connected to the center portion of the pad which is exposed through the hole of the solder resist layer. For example, a solder ball, a solder bump or the like may be used as this connection terminal. Another member to connect to the connection terminal may be a memory module, a multi-chip module, a mother board, a daughter board or the like.

While the pad can be connected to a conductive member such as a conductor circuit or a through hole, it can be formed unconnected to such a conductive member.

The insulating substrate may be made of a synthetic resin alone, or a composite resin material comprising a synthetic resin and an inorganic filler or an inorganic cloth. It is possible to provide a conductor circuit, a through hole or the like on the surface of the insulating substrate or inside the substrate. Further, the insulating substrate may be provided with a mount section where an electronic part is to be mounted.

It is preferable that the solder resist layer contains an inorganic filler comprising graphite, iron oxide or manganese dioxide. It is thus possible to form a solder resist layer with a fast heat moving speed. Particularly, iron oxide has a high thermal conductivity and easily becomes black.

It is preferable that the inorganic filler should be powder having an average particle size of 5 $\mu$m or smaller. This can reduce the amount of addition of an inorganic filler which turns the solder resist layer black.

The inorganic filler may have a shape of a particle as well as a needle shape or a whisker shape.

It is preferable that the inorganic filler is contained in the solder resist layer in an amount of 10% by volume or greater. This ensures the color of the solder resist layer is black.

When the inorganic filler is conductive, the inorganic filler is contained in the solder resist layer in an amount of 70% by volume or less in order to ensure the insulation property of the solder resist layer.

It is preferable that light absorption of the solder resist layer is equal to or greater than 60%. This further improves the efficiency of thermal absorption, thereby further enhancing the heat discharging performance of the solder resist layer.

The solder resist may be formed using a thermosetting solder resist, photo-curing solder resist or the like.

It is preferable that the printed wiring board should have a mount section on the surface of the insulating substrate where an electronic part is to be mounted, and the surface of the mount section should be covered with the solder resist layer. With this structure, the solder resist layer can directly absorb heat generated by an electronic part mounted on the mount section, and can thus further improve its thermal absorption efficiency.

According to a third aspect of this invention, there is provided a printed wiring board having an insulating substrate provided on a surface thereof with pads for connection of connection terminals, the surface of the insulating substrate being covered with a white solder resist layer, including peripheral edges of the pads, the solder resist layer containing an inorganic filler containing at least titanium oxide.

The advantages of the third aspect of this invention will be discussed below. According to the third aspect of this invention, as the solder resist layer contains an inorganic filler containing titanium oxide, it easily absorbs heat. After the solder resist layer actively absorbs the heat generated by an electronic part, it generates far infrared radiation and promptly discharges heat in the air. The larger the amount of heat generated by an electronic part is, the greater the amount of far infrared radiation generated becomes, ensuring efficient heat discharge.

The solder resist layer becomes white when it contains titanium oxide. As the white solder resist layer rapidly discharges the absorbed heat from its surface, it is excellent in heat discharge.

The heat discharging performance of the solder resist layer discussed above drops the surface temperature of an electronic part and permits the electronic part to function properly.

Further, the solder resist layer covers the peripheral edge of a pad to connect to a connection terminal, through which electricity is exchanged between the printed wiring board and another member. The heat absorbed by the solder resist layer is thus transmitted to the connection terminal efficiently, and can efficiently be discharged via the member that is connected to the connection terminal. The printed wiring board according to the third aspect of the invention demonstrates excellent heat discharging performance.

The peripheral edge of the pad is covered with the solder resist layer, but the center portion is not.

The peripheral edge of the pad is a portion which has a certain width from the contour of the pad toward the center. It is preferable that the width of the peripheral edge of the pad covered with the solder resist layer should be 0.010 mm to 0.15 mm. When this width is less than 0.010 mm, the heat absorbed by the solder resist layer may not be transmitted to the connection terminal efficiently. When the width is greater than 0.15 mm, the solder resist layer may interfere with connection of the connection terminal to the pad.

The white solder resist layer has a hole in, for example, a portion corresponding to the center portion of the pad. This hole may be formed by forming a solder resist layer on the entire surface of the insulating substrate and then irradiating a beam from a carbon dioxide laser, a YAG laser, an excimer laser or the like on a hole-to-be-formed portion of the solder resist layer, thereby burning out that portion. Alternatively, a solder resist layer having a hole may be formed by screen printing.

A connection terminal through which electricity is exchanged with another member is connected to the center portion of the pad which is exposed through the hole of the solder resist layer. For example, a solder ball, a solder bump, a conductive resin or the like may be used as this connection terminal. Another member to connect to the connection terminal may be a memory module, a multi-chip module, a mother board, a daughter board or the like.

While the pad can be connected to a conductive member such as a conductor circuit or a through hole, it can be formed unconnected to such a conductive member.

The insulating substrate may be made of a synthetic resin alone, or a composite resin material comprising a synthetic resin and an inorganic filler or an inorganic cloth. It is possible to provide a conductor circuit, a through hole or the like on the surface of the insulating substrate or inside the substrate. Further, the insulating substrate may be provided with a mount section where an electronic part is to be mounted.

It is preferable that the inorganic filler is powder having an average particle size of 5 μm or smaller. This further improves the heat discharging effect of the solder resist layer.

It is preferable that a powder inorganic filler should have an average particle size of 0.05 μm or larger. This is because the finer the particles become, the better the heat discharging efficiency of far infrared radiation becomes.

The inorganic filler may have a shape of a particle as well as a needle shape, a whisker shape or a combination of those shapes. The inorganic filler may be, for example, of $ZrO_2$ (zirconium oxide), $Fe_2O_3$ (iron oxide), $Y_2O_3$ (yttrium oxide) or the like in addition to titanium oxide.

It is preferable that the solder resist layer should contain titanium oxide in an amount of 10 to 80% by weight. This further improves the heat discharging effect of the solder resist layer. When the amount of the titanium oxide content is less than 10% by weight, the heat discharging effect of the solder resist layer may decrease. When the amount of the titanium oxide content exceeds 80% by weight, however, the adhesion strength of the solder resist layer as an insulating coat may drop.

It is preferable that the inorganic filler should be contained in the solder resist layer in an amount of 10% by weight or greater. This further enhances the heat discharging effect of the solder resist layer. The upper limit of the amount of the inorganic filler content is preferably 80% by weight from the viewpoint of the adhesion property of the solder resist layer.

The solder resist may be formed using a thermosetting solder resist, photo-curing solder resist or the like.

It is preferable that the printed wiring board should have a mount section on the surface of the insulating substrate where an electronic part is to be mounted, and the surface of the mount section should be covered with a white solder resist layer. With this structure, the solder resist layer can directly absorb heat generated by an electronic part mounted on the mount section, and can thus further improve its thermal absorption efficiency.

According to a fourth aspect of this invention, there is provided a printed wiring board having an insulating substrate provided on a surface thereof with pads for connection of connection terminals, the surface of the insulating substrate being covered with a green solder resist layer, including peripheral edges of the pads.

According to the fourth aspect of the invention, the green solder resist layer has a high heat radiation property. As the insulating substrate is covered with the green solder resist layer, the heat accumulated in the insulating substrate can efficiently be radiated outside. Heat is relatively likely to be accumulated in the pad to which a connection terminal for implementing external exchange of electricity is connected. Covering also the peripheral edge of the pad with the green solder resist layer allows heat at the periphery of the pad to be radiated efficiently.

From the viewpoint of heat radiation, it is preferable that the green solder resist layer should particularly contain an inorganic filler such as alumina or silica gel. It is preferable that the inorganic filler content in the solder resist layer should be 10% to 80% by weight.

The solder resist may be formed using a thermosetting solder resist, photo-curing solder resist or the like.

According to the fourth aspect of the invention, the surface of the mount section should preferably be covered with the green solder resist layer as in the second and third aspects of the invention.

DETAILED DESCRIPTION OF THE INVENTION

First Embodiment

A printed wiring board and a method of manufacturing the same according to a first embodiment of the present invention will now be described referring to FIGS. 1 through 7.

Figure 1:
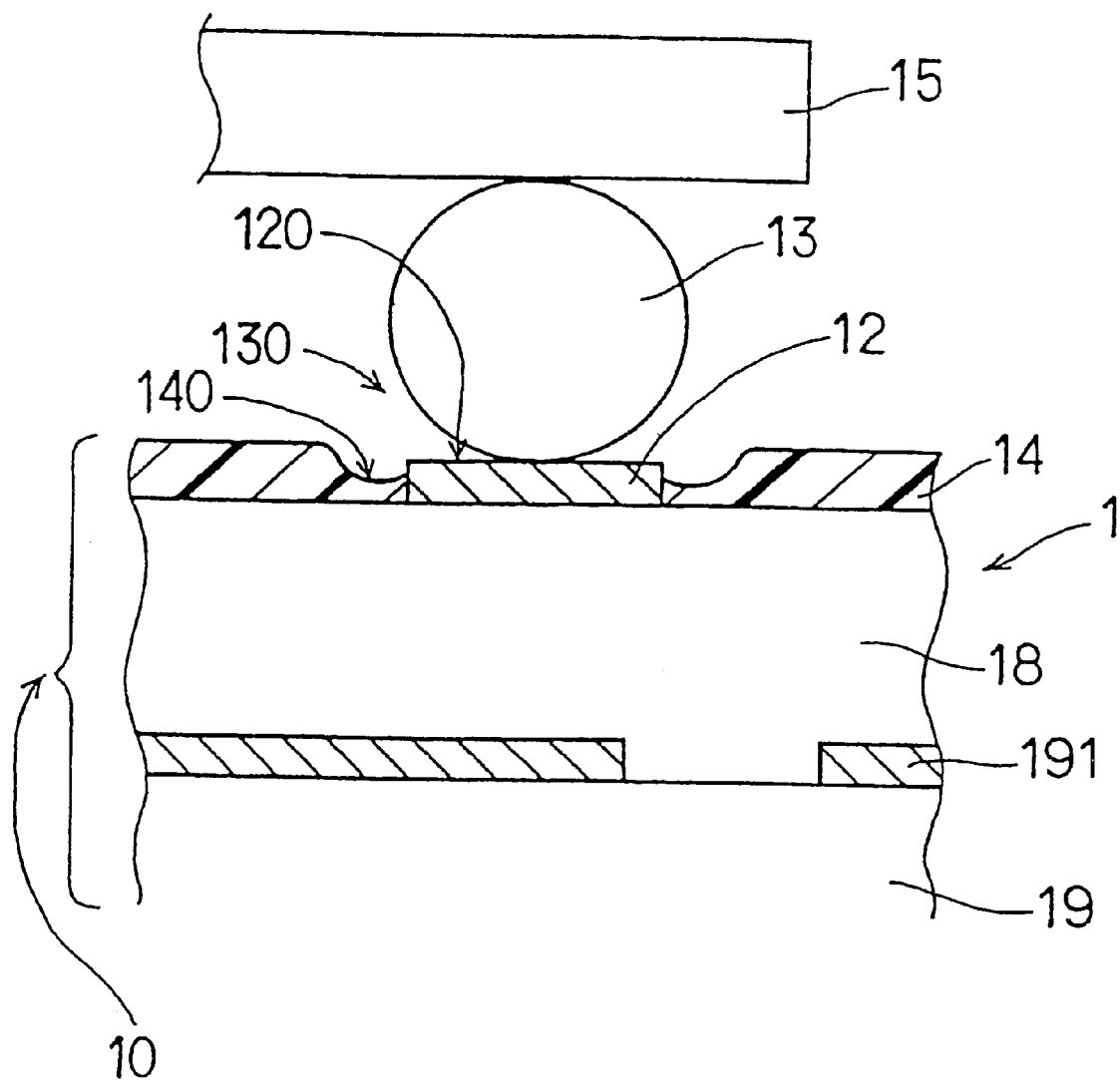
FIG. 1 is an explanatory cross-sectional view of a printed wiring board provided with a solder ball and an electronic part according to a first embodiment.
Figure 2:
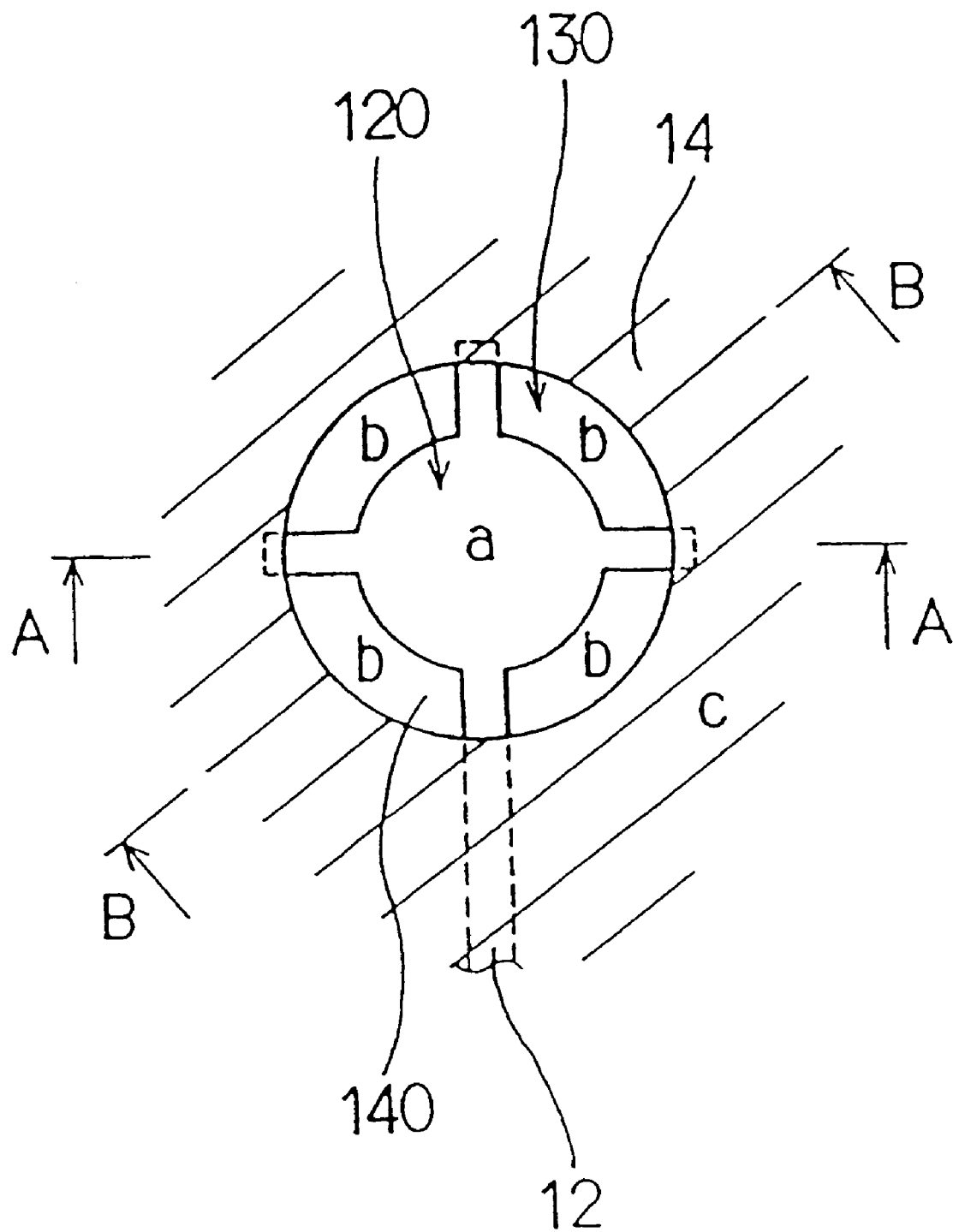
FIG. 2 is an explanatory plan view showing the essential portions of the printed wiring board according to the first embodiment.

As shown in FIGS. 1 and 2, a printed wiring board 1 according to this embodiment has a conductor circuit 12 on an insulating layer 18, and a surface insulating layer 14 on the surfaces of the insulating layer 18 and the conductor circuit 12. The surface insulating layer 14 comprises a solder resist layer or a glass cloth resin layer.

Part of the conductor circuit 12 has an exposed conductor section 120 with an exposed surface, and a surface insulating layer 140 around the exposed conductor section 120 forms a recessed section set lower than the surface of the exposed conductor section 120 and higher than the surface of the insulating layer 18. The surface insulating layer of the recessed section is in contact with the sides of the exposed conductor section 120.

A portion "a" in FIG. 2 is the exposed conductor section 120, a portion "b" is the surface insulating layer 140 which surrounds the exposed conductor section 120, and a portion "c" is the surface insulating layer 14 on which a laser beam to be discussed later does not hit.

The portions "a" and "b" form a bump 130 for a solder ball 13 to be discussed later. This bump 130 is the aforementioned recessed section.

Figure 3:
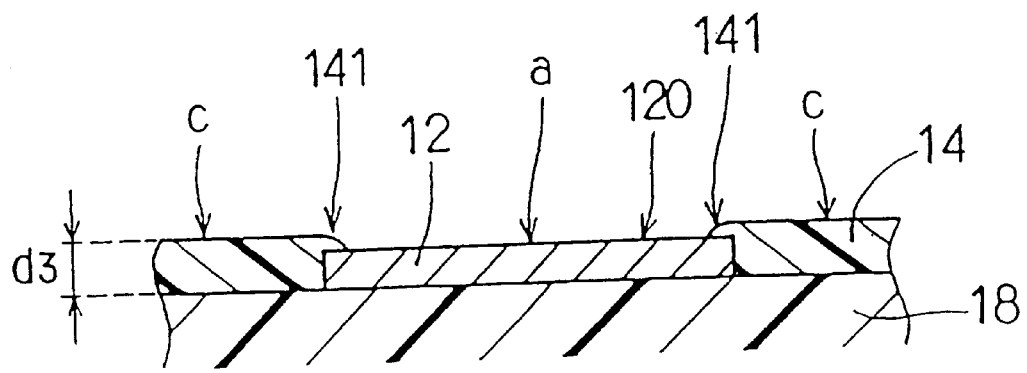
FIG. 3 is a cross-sectional view of the first embodiment as seen from the line A—A in FIG. 2.
Figure 4:
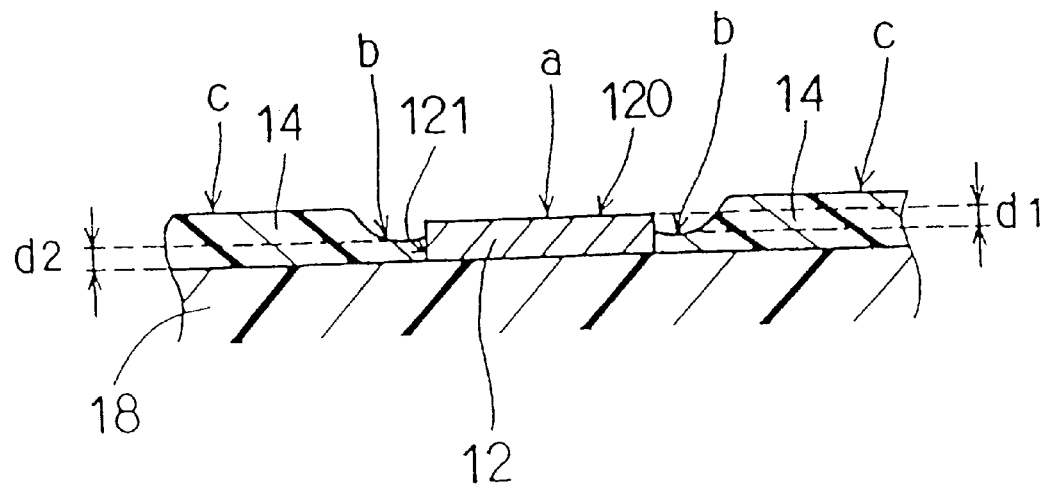
FIG. 4 is a cross-sectional view of the first embodiment as seen from the line B—B in FIG. 2.

As shown in FIGS. 3 and 4, a distance d1 between the surface of the exposed conductor section 120 and the surface of the surface insulating layer 140 is 5 $\mu$m.

A distance d3 between the surface of the exposed surface insulating layer 14 and the surface of the insulating layer 18 is 35 $\mu$m, and a distance d2 between the surface of the surface insulating layer 140 and the surface of the insulating layer 18 is 20 $\mu$m.

As shown in FIG. 1, the printed wiring board 1 comprises an internal board 19 provided with an internal conductor circuit 191, the insulating layer 18 provided on the surface of the internal conductor circuit 191, and the conductor circuit 12 provided on the surface of the insulating layer 18.

The surface insulating layer 14 is provided on the surface of the insulating layer 18.

As shown in FIG. 2, the circular bump 130 where the solder ball 13 is to be placed is provided on the printed wiring board 1. The solder ball 13 electrically connects an electronic part 15 to the conductor circuit 12.

The bump 130 is formed by the exposed conductor section 120, which is an exposed part of the conductor circuit 12, the surface insulating layer 140 located around the exposed conductor section 120 and positioned lower than the surface of the exposed conductor section 120, and the surface insulating layer 14 positioned higher than the surface of the exposed conductor section 120.

As shown in FIGS. 1, 3 and 4, a corner portion 141 of the surface insulating layer 140 around the exposed conductor section 120 is formed to have a curved surface.

A method of manufacturing the printed wiring board 1 will now be described. First, the conductor circuit 12 is formed on the insulating layer 18. Next, a solder resist layer or glass cloth resin layer is provided on the surfaces of the insulating layer 18 and the conductor circuit 12, yielding the surface insulating layer 14.

Then, a laser beam is irradiated on the surface insulating layer 14 to expose part of the conductor circuit 12, forming the exposed conductor section 120, and to make the surface insulating layer 140 around the conductor circuit 12 lower than the surface of the exposed conductor section 120. The exposed conductor section 120 and the surface insulating layer 140 define a recessed section to be the aforementioned bump 130.

The manufacturing method will be described more specifically. The surface or copper foil of a copper-clad laminate is patterned to yield the internal board 19 having the internal conductor circuit 191 formed thereon. A prepreg and copper foil are laminated on the surfaces of the internal conductor circuit 191 and the internal board 19, and the copper foil is etched properly. As a result, the insulating layer 18 and the conductor circuit 12 are formed on the surface of the internal board 19, and the resulting structure is the multi-layer substrate 10.

Next, a solder resist layer is formed on the surface of the multi-layer substrate 10 (including the surface of the conductor circuit 12) using a thermosetting or photo-curing solder resist. Alternatively, a glass cloth resin layer is formed in place of the solder resist layer. Consequently, the surface insulating layer 14 is acquired.

Then, a laser beam is irradiated in a predetermined portion (circular portion) of the surface insulating layer 14.

At this time, the portion where the laser beam is irradiated includes a portion where the conductor circuit 12 and the surface insulating layer 14 are laminated on the insulating layer 18, and a portion where the surface insulating layer 14 directly lies on the insulating layer 18.

An excimer laser with a wavelength of 248 nm and output power of 50 W which is slightly higher than the power that can remove the surface insulating layer 14 provided on the conductor circuit 12 is used to generate the laser beam.

The irradiation of the laser beam forms the exposed conductor section 120 in the portion where the conductor circuit 12 is present. With regard to the portion where the conductor circuit 12 is not present, the surface insulating layer 14 can be vaporized to a level lower than the surface of the exposed conductor section 120.

Consequently, the bump 130 where the solder ball 13 is to be placed is formed, thus yielding the printed wiring board 1 according to this embodiment. Thereafter, the electronic part 15 is placed on the solder ball 13 put in the bump 130.

The advantages of this embodiment will now be explained. In the printed wiring board 1 of this embodiment, the surface insulating layer 140 (portion "b") around the exposed conductor section 120 (portion "a") is positioned lower than the surface of the exposed conductor section 120 and higher than the surface of the insulating layer 18, and is in contact with sides 121 of the exposed conductor section 120.

Accordingly, the sides 121 of the conductor circuit 12 are covered with the surface insulating layer 140, thus reducing the exposed area of the sides 121. It is therefore possible to increase the strength of adhesion of the conductor circuit 12 to the insulating layer 18, preventing separation of the conductor circuit 12 therefrom.

Further, placed in the bump 130 defined by the exposed conductor section 120 and the surface insulating layer 140 is the solder ball 13 through which the electronic part 15 is connected to the printed wiring board 1. As the exposed amount of the sides 121 of the exposed conductor section 120 is small, the solder ball 13 remains on the exposed conductor section 120 without being flattened. It is thus possible to maintain the distance between the electronic part 15 and the exposed conductor section 120, which can enhance the reliability of connection therebetween.

Figure 5:
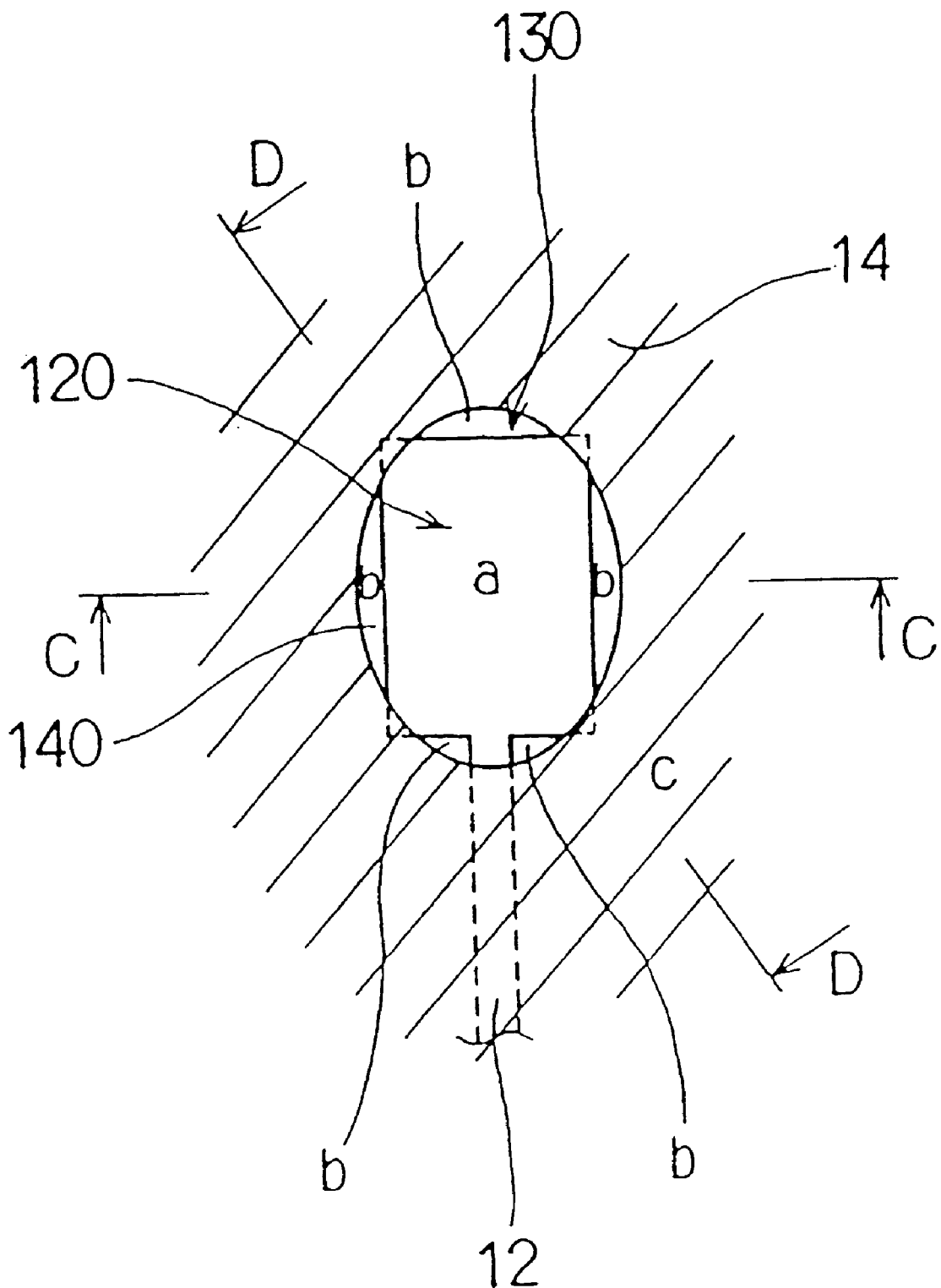
FIG. 5 is an explanatory plan view showing the essential portions of a printed wiring board with an oval bump according to the first embodiment.
Figure 6:
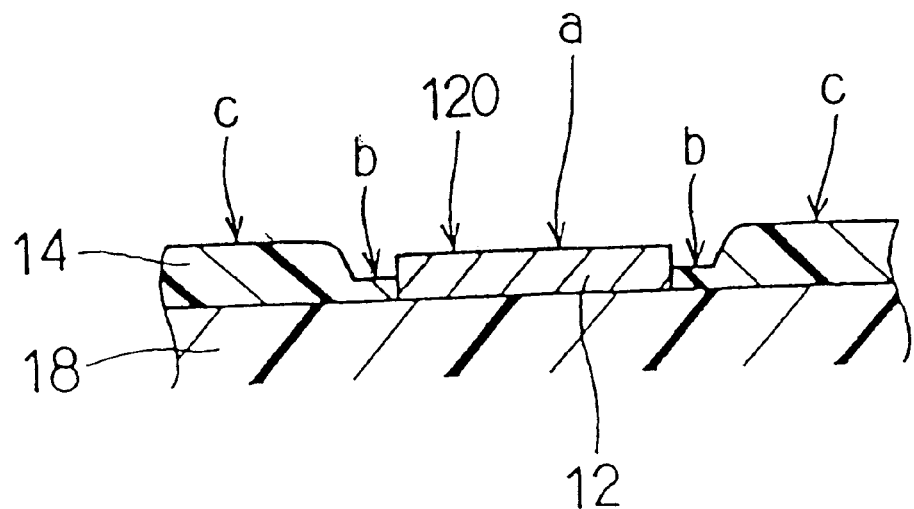
FIG. 6 is a cross-sectional view of the first embodiment as seen from the line C—C in FIG. 5.
Figure 7:
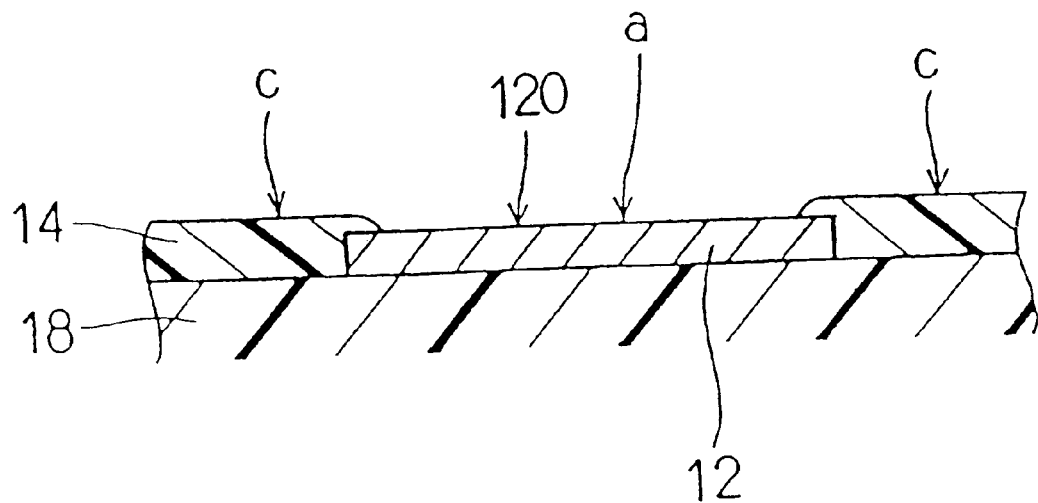
FIG. 7 is a cross-sectional view of the first embodiment as seen from the line D—D in FIG. 5.

The printed wiring board 1 according to this embodiment may have a bump 130 of another shape. FIGS. 5 to 7 exemplify such a printed wiring board 1 with an oval bump 130 and part of the conductor circuit 12 of a rectangular shape. In the printed wiring board 1, as shown in FIGS. 5 through 7, part of the conductor circuit 12 also has an exposed conductor section 120 (portion "a") with an exposed surface, and the surface insulating layer 140 (portion "b") around the exposed conductor section 120 is positioned lower than the surface of the exposed conductor section 120 and higher than the surface of the insulating layer 18, and is in contact with sides 121 of the exposed conductor section 120.

Figure 8:
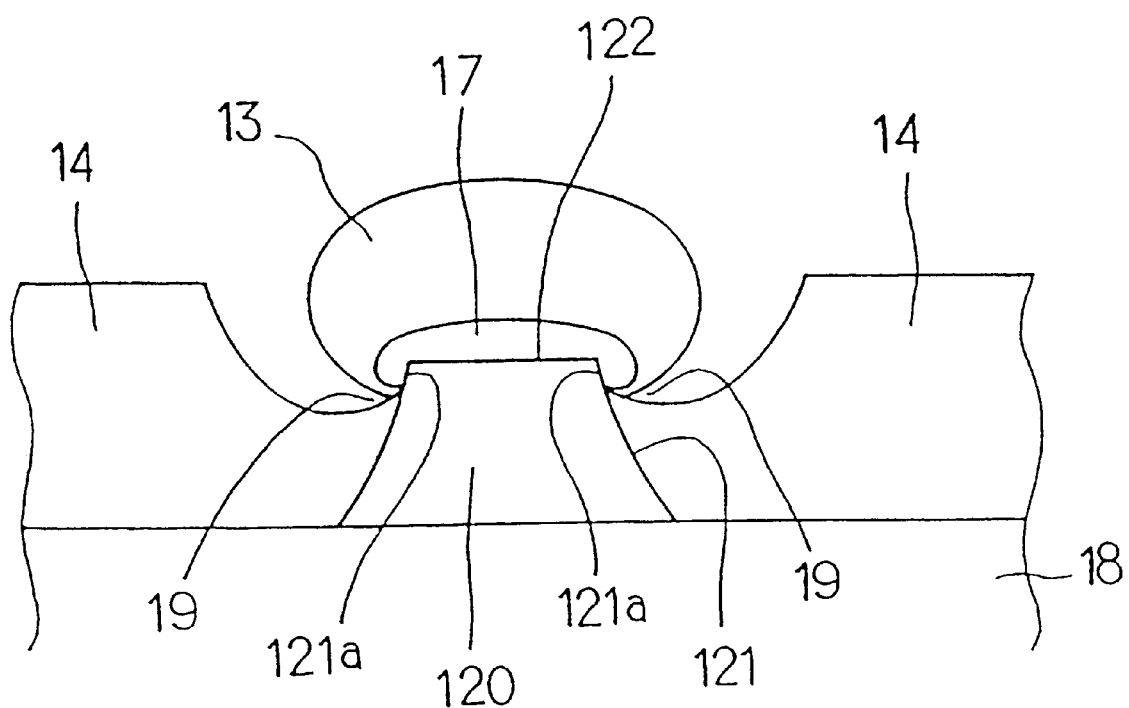
FIG. 8 is a cross-sectional view of a printed wiring board to which a solder ball is bonded according to the first embodiment.

It is preferable that, as shown in FIG. 8, the exposed conductor section 120 is covered with a metal plated film 17 in such a way as to surround the upper end portions of the sides of the exposed conductor section 120 from the surface 122 thereof. The solder ball 13 should be bonded to the exposed conductor section 120 and should be partly located in a cavity 19 formed between the peripheral edge of the metal plated film 17 and the sides 121 of the exposed conductor section 120. This allows the solder ball 13 to come into the cavity 19 and to show excellent bonding due to its anchoring effect.

The metal plated film 17 comprises, for example, a nickel plated layer with a thickness of 3 μm and a gold plated layer with a thickness of 0.1 μm, while the exposed conductor section 120 is formed of a copper foil with a thickness of 18 μm. The solder ball 13 is 0.2 mm in diameter. The metal plated film may be formed of a solder plated film, Sn plated film, Pb plated film or the like. The conductor circuit 12 including the exposed conductor section 120 can be formed by a patterning method, such as so-called subtractive method or additive method.

The metal plated film 17 may be formed on the surface of the exposed conductor section 120 by, for example, electroplating, and a solder ball can be bonded to the surface of the metal plated film 17 by heat-melting.

Second Embodiment

A printed wiring board according to a second embodiment of this invention will now be described referring to FIGS. 9 through 13.

Figure 9:
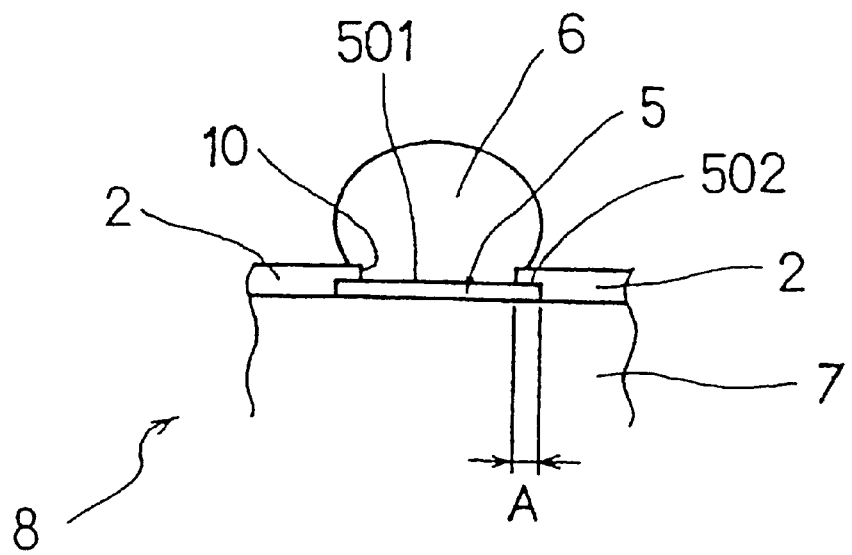
FIG. 9 is an explanatory enlarged cross-sectional view of the essential portions of a printed wiring board according to a second embodiment, illustrating how the connection terminal of the printed wiring board is connected.

As shown in FIG. 9, a printed wiring board 8 according to this embodiment has a pad 5 for connection of a connection terminal 6. The pad 5 is provided on the surface of an insulating substrate 7. A black solder resist layer 2 is formed on the surface of the insulating substrate 7 and the peripheral edge 502 of the pad 5.

The solder resist layer 2 in use is a thermosetting solder resist. The thermosetting solder resist contains 70% by volume of epoxy-based resin and 30% by volume of an inorganic filler of iron oxide. The inorganic filler is powder having an average particle size of 2.3 μm. The solder resist layer has light absorption of 78%.

Figure 10:
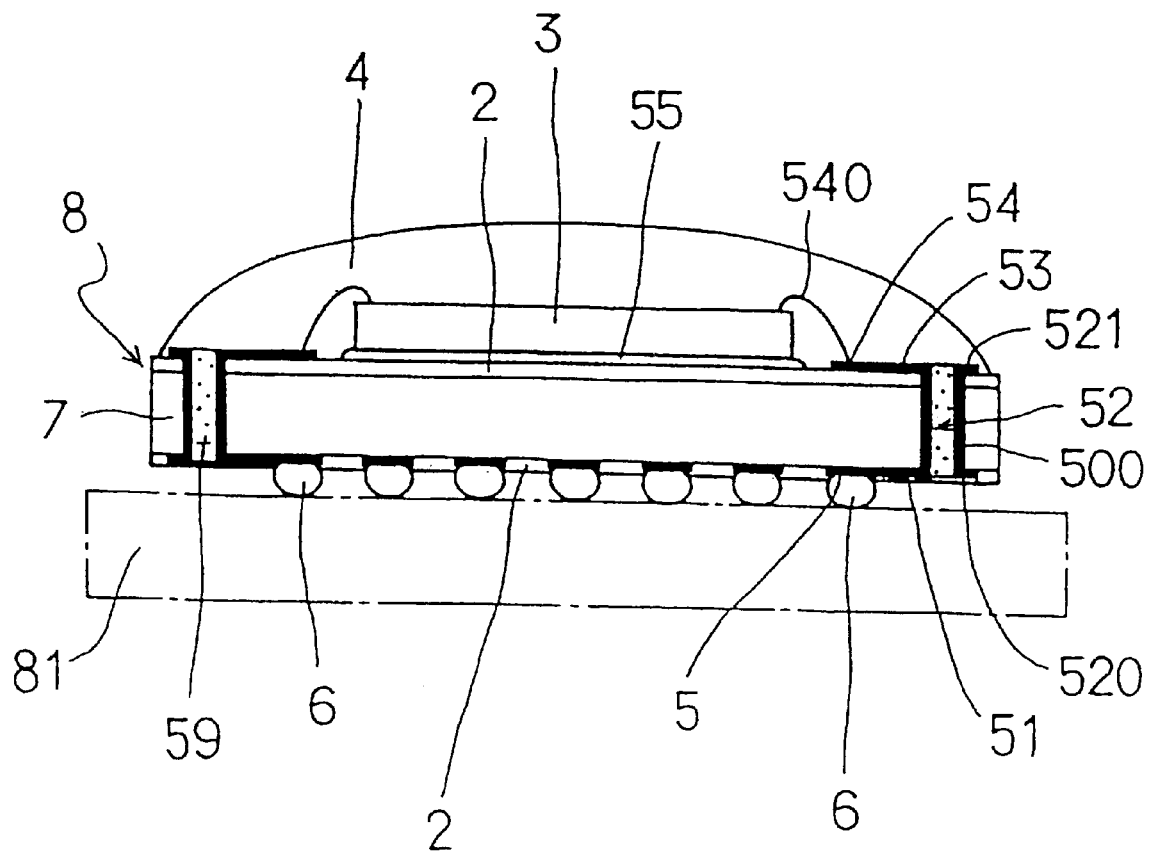
FIG. 10 is a cross-sectional view of the printed wiring board according to the second embodiment as seen from the line B—B in FIGS. 11 and 12.
Figure 11:
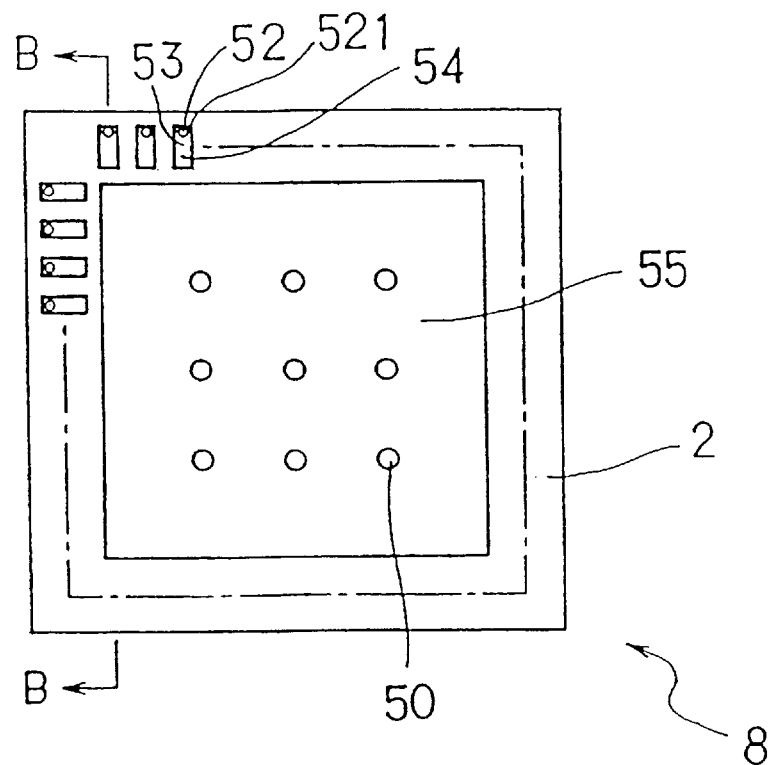
FIG. 11 is a plan view of the printed wiring board according to the second embodiment.

Provided on the surface of the insulating substrate 7 are a mount section 55 where an electronic part 3 is to be mounted, bonding pads 54, conductor circuits 53, and lands 521 of through holes 52, as shown in FIGS. 10 and 11. As shown also in FIGS. 10 and 11, lands 520 of the through holes 52, conductor circuits 51 and the pads 5 for connection of the connection terminals 6 are provided at the back of the insulating substrate 7.

Figure 12:
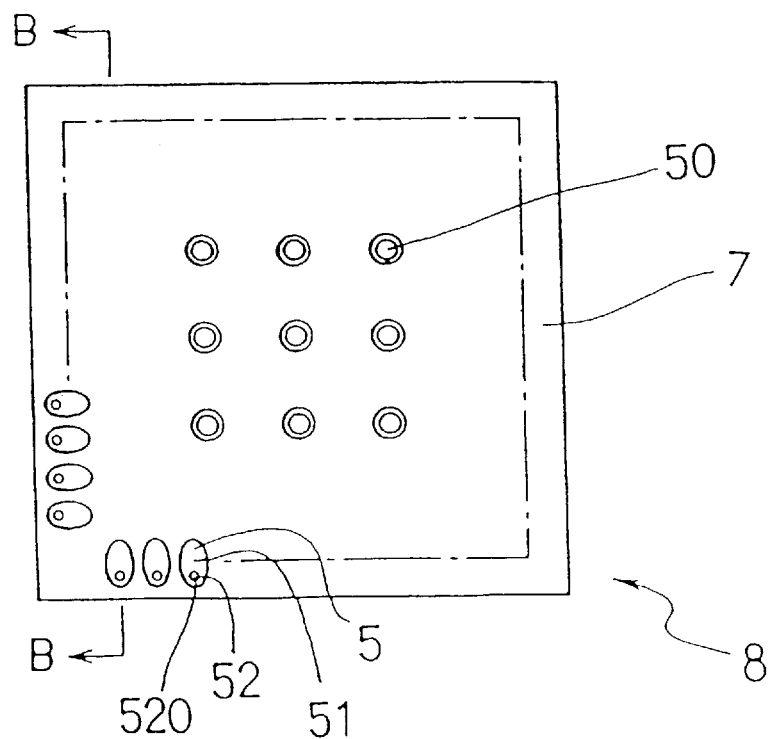
FIG. 12 is a back view of the printed wiring board according to the second embodiment.

As shown in FIGS. 11 and 12, thermal via holes 50 for discharging heat generated by the electronic part 3 are formed under the mount section 55. The inner walls of the through holes 52 and thermal via holes 50 are covered with a metal plated film 500 of Cu, Ni, Au or the like, with solder 59 filling those holes as shown in FIG. 10.

The connection terminals 6 are solder balls as shown in FIG. 9. The peripheral edge 502 of each pad 5 has a width A of 0.075 mm and is covered with the solder resist layer 2. A center portion 501 of the pad 5 is exposed through a hole 10 in the solder resist layer 2.

Figure 13:
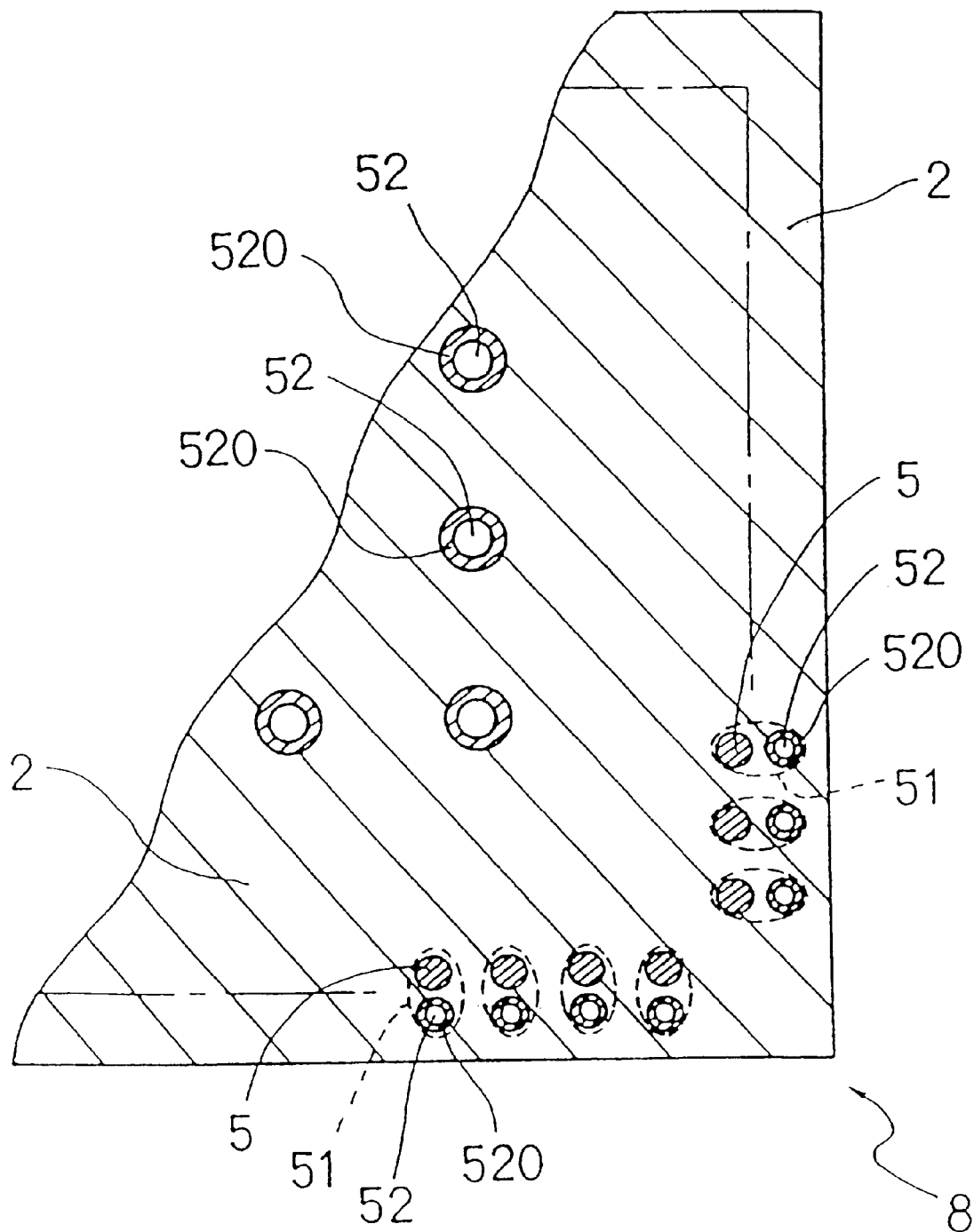
FIG. 13 is a back view of the printed wiring board according to the second embodiment for explaining the covering state of a solder resist layer.

As shown in FIGS. 10 and 13, the solder resist layer 2 covers the entire top and bottom surfaces of the insulating substrate 7 excluding those portions around the bonding pads 54, the through holes 52 and the thermal via holes 50. The solder resist layer 2 has a thickness of 30 μm. The holes 10 are formed by irradiating an excimer laser beam on the solder resist layer 2.

As shown in FIG. 10, the electronic part 3 is connected to the mount section 55 by a solder paste. The electronic part 3 is electrically connected to the bonding pads 54 via bonding wires 540. The electronic part 3 is sealed with a sealing resin 4 of epoxy-based resin or the like. The insulating substrate 7 is a glass epoxy resin substrate. The mount section 55, the bonding pads 54, the conductor circuits 53 and 51 and the pads 5 are formed by etching their copper foils and covering the surfaces with a metal plated film plated with Ni—Au or the like.

The printed wiring board 8 of this embodiment is a plastic package whose chip size is approximately the same as the size of the electronic part 3. The printed wiring board 8 is connected to a mother board 81 via the connection terminals 6.

The advantages of this embodiment will now be described. As the solder resist layer 2 is black, it easily absorbs heat. After the solder resist layer 2 actively absorbs the heat generated by the electronic part 3, therefore, the solder resist layer 2 discharges the heat into the air from the surface. This speeds up heat movement from the solder resist layer 2 to the air. The black solder resist layer 2 can thus promptly discharge the heat generated by the electronic part 3 into the air, and is excellent in heat discharge.

As shown in FIG. 9, the solder resist layer 2 covers the peripheral edges 502 of the pads 5 for connection of the connection terminals 6. This allows the heat, absorbed by the solder resist layer 2, to be efficiently transmitted to the connection terminals 6 and to be then efficiently discharged via the mother board 81 connected to the connection terminals 6.

As shown in FIGS. 10 and 13, the solder resist layer 2 is provided under the mount section 55, so that the layer 2 can efficiently absorb the heat from the electronic part 3.

Since the solder resist layer 2 is provided over a wide area, substantially the entire top and bottom surfaces of the insulating substrate 7, heat exchange can be performed quickly.

Third Embodiment

A printed wiring board according to a third embodiment of this invention will be discussed below. The printed wiring board of this embodiment uses a white solder resist layer. The solder resist layer contains 60% by weight of epoxy-based resin and 40% by weight of an inorganic filler which essentially comprises titanium oxide. The inorganic filler is powder having an average particle size of 3 µm. The inorganic filler contains 58% by weight of titanium oxide, 1.5% by weight of $Al_2O_3$, and 0.3% by weight of $K_2O$.

The solder resist layer has a thickness of 40 µm. The peripheral edge of each pad for connection of the associated connection terminal has a width A of 0.100 mm (see FIG. 9). The other structure is the same as that of the second embodiment.

The advantages of this embodiment will now be discussed. As the solder resist layer contains an inorganic filler including titanium oxide, it easily absorbs heat. After the solder resist layer actively absorbs the heat generated by an electronic part, therefore, it generates far infrared radiation to promptly discharge the heat into the air. The larger the amount of heat generated by the electronic part is, the greater the amount of far infrared radiation is generated, so that the heat is discharged efficiently.

As the solder resist layer contains titanium oxide, it becomes white. Because the white solder resist layer discharges the absorbed heat from its entire surface, the heat discharging speed is fast.

This embodiment provides the same advantages as those of the second embodiment.

Fourth Embodiment

A printed wiring board according to a fourth embodiment of this invention will be discussed below.

In this embodiment, a green solder resist layer is used. The solder resist layer contains 50% by weight of epoxy-based resin and 50% by weight of an inorganic filler which essentially comprises alumina. The other structure is the same as that of the second embodiment.

The advantages of this embodiment will now be discussed. As the solder resist layer contains an inorganic filler including alumina, it has excellent thermal conductivity and can quickly discharge heat, generated by an electronic part, into the air. This embodiment can also have the same advantages as those of the second embodiment.

As apparent from the foregoing description, this invention provides a printed wiring board with excellent heat discharging performance, which has enhanced adhesion strength between a conductor circuit and an insulating substrate and ensures highly reliable connection between this printed wiring board and a to-be-mounted part such as another electronic part or another printed wiring board at the time of connecting such a part to this printed wiring board via solder balls applied to bumps, ball pads or the like provided on the conductor circuit and the insulating substrate, and a method of manufacturing the same.

What is claimed is:

1. A printed wiring boards comprising:

an insulating layer;

a conductor circuit provided on the insulating layer;

a surface insulating layer provided on surfaces of said insulating layer and said conductor circuit and formed of a solder resist layer or a glass cloth resin layer, wherein part of said conductor circuit has an exposed conductor section with an exposed surface;

said surface insulating layer around said exposed conductor section forming a recessed section level having a height which is the same as or lower than said surface of said exposed conductor section and higher than said surface of said insulating layer, said surface insulating layer of said recessed section being in contact with sides of said exposed conductor section.

2. The printed wiring board according to claim 1, wherein said surface insulating layer comprises a glass cloth resin layer.

3. The printed wiring board according to claim 1, wherein said surface insulating layer has a double-layer structure comprising a solder resist layer and a glass cloth resin layer.

4. The printed wiring board according to claim 1, wherein said surface insulating layer is positioned lower than said surface of said exposed conductor section by 0 to about 15 µm.

5. The printed wiring board according to claim 1, further comprising:

a metal plated film covering said exposed conductor section in such a way as to surround upper end portions of said sides of said exposed conductor section from said surface thereof, and a solder ball connected to said exposed conductor section and partly located in a cavity formed between a peripheral edge of said metal plated film and said sides of said exposed conductor section.

6. A method of manufacturing a printed wiring board comprising the steps of:

forming a conductor circuit on an insulating layer;

forming a surface insulating layer on said insulating layer and a surface of said conductor circuit; and irradiating said surface insulating layer with a laser beam to expose a part of said conductor circuit, thereby forming an exposed conductor section and setting said surface insulating layer around said conductor circuit lower than a surface of said exposed conductor section, thereby forming a recessed section.

7. The method according to claim 6, wherein said surface insulating layer comprises a glass cloth resin layer.

8. The method according to claim 6, wherein said surface insulating layer has a double-layer structure comprising a solder resist layer and a glass cloth resin layer.

9. A printed wiring board, comprising:

an insulating substrate;

a plurality of pads provided on a surface of the insulating substrate for connecting connection terminals; and a black solder resist layer covering said surface of said insulating substrate and peripheral edges of said pads.

10. The printed wiring board according to claim 9, wherein said solder resist layer contains an inorganic filler comprising graphite, iron oxide or manganese dioxide.

11. The printed wiring board according to claim 10, wherein said inorganic filler is powder having an average particle size of 5 µm or smaller.

12. The printed wiring board according to claim 10, wherein said inorganic filler is contained in said solder resist layer in an amount of 10% by volume or greater.

13. The printed wiring board according to claim 9, wherein light absorption of said solder resist layer is equal to or greater than 60%.

14. A printed wiring board, comprising:

an insulating substrate;

a plurality of pads provided on a surface of the insulating substrate for connecting connection terminals; and a white solder resist layer covering said surface of said insulating substrate and peripheral edges of said pads, said white solder resist layer containing an inorganic filler including titanium oxide.

15. The printed wiring board according to claim 14, wherein said inorganic filler is powder having an average particle size of 5 μm or smaller.

16. The printed wiring board according to claim 14, wherein said solder resist layer contains titanium oxide in an amount of 10 to 80% by weight.

17. The printed wiring board according to claim 14, wherein said inorganic filler is contained in said solder resist layer in an amount of 10% by weight or greater.

18. A printed wiring board, comprising:

an insulating substrate having first and second surfaces;

a plurality of pads provided on said first surface of the insulating substrate for connecting connection terminals; and a green solder resist layer covering said first surface of said insulating substrate and peripheral edges of said pads.

19. The printed wiring board according to claim 18, further comprising a mount section on one of the first and second surfaces of said insulating substrate for receiving an electronic part, wherein a surface of said mount section is covered with said green solder resist layer.

20. The printed wiring board according to claim 19 wherein said mount section is provided on said first surface adjacent to said plurality of pads.

\* \* \* \* \*